(12) United States Patent
Guevara

(10) Patent No.: US 12,009,272 B2
(45) Date of Patent: Jun. 11, 2024

(54) INTEGRAL REDISTRIBUTION LAYER FOR WCSP

(71) Applicant: Texas Instruments Incorporated, Dallas, TX (US)

(72) Inventor: Rafael Jose Lizares Guevara, Metro Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 193 days.

(21) Appl. No.: 17/526,533

(22) Filed: Nov. 15, 2021

(65) Prior Publication Data

US 2023/0154813 A1    May 18, 2023

(51) Int. Cl.
*H01L 23/31*    (2006.01)
*H01L 23/00*    (2006.01)

(52) U.S. Cl.
CPC .......... *H01L 23/3114* (2013.01); *H01L 24/05* (2013.01); *H01L 24/11* (2013.01); *H01L 24/16* (2013.01); *H01L 2224/0231* (2013.01); *H01L 2224/0391* (2013.01); *H01L 2224/0401* (2013.01); *H01L 2224/05541* (2013.01); *H01L 2224/16145* (2013.01)

(58) Field of Classification Search
CPC .................................................. H01L 23/3114
See application file for complete search history.

(56) References Cited

U.S. PATENT DOCUMENTS

| | | | | |
|---|---|---|---|---|
| 5,977,632 A | * | 11/1999 | Beddingfield | H01L 24/81 |
| | | | | 257/E21.511 |
| 6,362,087 B1 | * | 3/2002 | Wang | H01L 23/3114 |
| | | | | 257/773 |
| 6,492,260 B1 | * | 12/2002 | Kim | H01L 21/7684 |
| | | | | 438/692 |
| 6,731,004 B2 | * | 5/2004 | Saitoh | H01L 24/11 |
| | | | | 257/750 |
| 6,762,115 B2 | * | 7/2004 | Lin | H01L 23/5222 |
| | | | | 257/E21.582 |
| 7,847,411 B2 | * | 12/2010 | Takaike | H01L 24/82 |
| | | | | 257/688 |
| 8,163,645 B2 | | 4/2012 | Thomas et al. | |
| 8,455,768 B2 | * | 6/2013 | Booth, Jr. | H01L 28/20 |
| | | | | 174/250 |
| 9,484,291 B1 | * | 11/2016 | Dhandapani | H01L 24/03 |

(Continued)

*Primary Examiner* — William A Harriston
(74) *Attorney, Agent, or Firm* — Ronald O. Neerings; Frank D. Cimino

(57) ABSTRACT

A wafer chip scale package (WCSP) includes a substrate including a semiconductor surface including circuitry electrically connected to die bond pads exposed by a passivation layer, and a top dielectric layer over the passivation layer. A dielectric layer bounded (DLB) cavity formed in the top dielectric layer includes a first cavity being a center through-cavity bounded by a second cavity being a partial through-cavity, the DLB cavity is lined with a seed layer. A capping dielectric layer that covers the DLB cavity except for an aperture over the first cavity. A cavity metal that is generally configured as an integral structure of continuous metal material having no interfaces is for filling the DLB cavity to form a metal filled cavity including over the aperture that has an electrical connection to the die bond pads. A solder ball over the cavity metal is positioned over the aperture.

24 Claims, 4 Drawing Sheets

(56) References Cited

U.S. PATENT DOCUMENTS

| | | | | |
|---|---|---|---|---|
| 9,735,124 B2* | 8/2017 | Chen | | H01L 24/11 |
| 10,483,132 B2* | 11/2019 | Lin | | H01L 23/3171 |
| 11,355,467 B2* | 6/2022 | Ko | | H01L 24/82 |
| 2002/0093089 A1* | 7/2002 | Lu | | H05K 3/326 |
| | | | | 257/700 |
| 2003/0025173 A1* | 2/2003 | Suminoe | | H01L 23/3114 |
| | | | | 257/E23.021 |
| 2006/0138671 A1* | 6/2006 | Watanabe | | H01L 24/02 |
| | | | | 257/773 |
| 2009/0280649 A1* | 11/2009 | Mayer | | H01L 21/7684 |
| | | | | 156/345.23 |
| 2009/0283877 A1* | 11/2009 | Tsai | | H01L 24/05 |
| | | | | 257/659 |
| 2010/0062600 A1* | 3/2010 | Utsuki | | H01L 24/03 |
| | | | | 257/E21.586 |
| 2011/0001234 A1* | 1/2011 | Ogumi | | H01L 24/03 |
| | | | | 257/737 |
| 2011/0101532 A1* | 5/2011 | Pohl | | H01L 21/76873 |
| | | | | 205/183 |
| 2012/0061823 A1* | 3/2012 | Wu | | H01L 24/13 |
| | | | | 257/E21.59 |
| 2016/0118328 A1* | 4/2016 | Hu | | H01L 23/49816 |
| | | | | 438/123 |
| 2020/0111760 A1* | 4/2020 | Huang | | H01L 21/486 |
| 2022/0302038 A1* | 9/2022 | Yu | | H01L 23/49816 |

* cited by examiner

INTEGRAL REDISTRIBUTION LAYER FOR WCSP

FIELD

This Disclosure relates to wafer chip scale packages (WCSPs).

BACKGROUND

One semiconductor technology is known as "wafer level chip scale packaging" with the packages known as wafer level chip scale packages ("WCSPs"), which are also known as WCSP die. Using a WCSP, unpackaged semiconductor dies without any surrounding layer of protective encapsulation such as a mold compound, are generally mounted on printed circuit boards (PCB). The structures needed for electrical connection of a WCSP to a PCB are usually fabricated on one surface of the semiconductor die while the plurality of semiconductor die are still integrally connected together on a single wafer.

For example, in a conventional form of WCSP, various layers including contact pads and then solder bumps thereon are formed on respective dies at the wafer level. For this purpose, at least one redistribution layer (RDL) is used which is an extra metal layer on a semiconductor die above the top metal layer that makes the input/output I/O pads of an integrated circuit (IC) available in other locations. After wafer singulation the WCSP may be attached, solder bumped top side down, onto a PCB. WCSPs have the advantage of being considerably smaller in size as compared to conventionally packaged IC dies and are thus ideal for certain applications, such as cellular phones and digital tablets, where the associated PCB is often constrained to have a small footprint. For a thickness reduction of the WCSP, one solution is using a smaller solder ball diameter so that the maximum solder thickness is reduced.

FIG. 1 shows a portion of conventional WCSP 100 shown as a bump on pad copper on anything (BOPCOA) structure including a solder ball 128 for an electrical connection to the bond pads 108 of the WCSP 100. A passivation (overcoat) layer 112 is generally formed in the wafer fabrication facility over the top metal layer including the bond pads 108, where the passivation layer 112 includes apertures to expose the bond pads 108 that are coupled to nodes in the circuitry 180. There are 3 additional layers described below (besides the seed layers) that electrically contact the bond pad 108 which are added on top of the passivation layer 112 that is performed during the wafer level bump processing.

There is a first seed layer 121 under a redistribution layer (RDL) 122 that generally comprises copper, and a dielectric layer 123 typically comprising a polyamide (PI) layer that is on the RDL 122. There is a second seed layer 124 above the dielectric layer 123. There is an under-bump metallization (UBM) layer 125 on the second seed layer 124, and the solder ball 128 is shown on the UBM layer 125. Excluding the seed layers, and the solder ball 128, the BOPCOA structure can be seen to include 3 layers. A typical thickness/height of the WCSP 100 is around 200 to 320 ilms, where the thickness is generally primarily due to the UBM layer 125 plus the solder ball 128 thereon.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize a conventional BOPCOA structure for a WCSP that uses standard photolithography and wet etching to etch layers is susceptible to generating several different process induced defects. For example, photoresist/polyimide issues including scumming or bubbles, and seed metal underetch. The wafer cycle time is also somewhat lengthy due to multiple layers involved in forming a conventional BOPCOA described above relative to the WCSP 100 shown in FIG. 1. Moreover, the WCSP 100 thickness due to the conventional BOPCOA structure may be too thick for some potential WC SP applications. The root cause of these problems is recognized to be the conventional BOPCOA structure and its process integration.

Disclosed aspects include a WCSP that comprises a substrate including a semiconductor surface including circuitry electrically connected to die bond pads exposed by a passivation layer, and a top dielectric layer over the passivation layer. A dielectric layer bounded (DLB) cavity formed in the top dielectric layer includes a first cavity being a center through-cavity bounded by a second cavity being a partial through-cavity, where the DLB cavity lined with a seed layer. A capping dielectric layer covers the DLB cavity except for an aperture over the first cavity. A cavity metal that is generally part of the RDL is generally configured as an integral structure of continuous metal material having no interfaces that fills the DLB cavity to form a metal filled cavity including over the aperture that has an electrical connection to the die bond pads. A solder ball over the cavity metal is positioned over the aperture.

Disclosed aspects thus include a new BOPCOA structure for a WCSP that is termed an integral RDL portion and integral structure, and enabling new process integrations. The new process integrations can include laser ablation as an alternative to standard photolithography form the DLB cavity, chemical mechanical planarization (CMP) as an alternative to standard wet etching to selectively remove the seed layer, and bottom-up metal (e.g., copper) plating form the a RDL including the integral RDL portion that removes the need for a plurality of metal plating steps, and the use of dielectric layer for tenting.

BRIEF DESCRIPTION OF THE DRAWINGS

Reference will now be made to the accompanying drawings, which are not necessarily drawn to scale, wherein:

FIG. 2A shows results for the in-process WCSP after forming a dielectric precursor layer on the top surface of a die comprising a substrate including circuitry electrically connected to bond pads that are exposed by a passivation layer, having the dielectric precursor layer thereon. FIG. 2B shows results after a two-step laser ablation process to form a DLB cavity in the dielectric precursor layer including a first cavity comprising a center through-cavity bounded by a second cavity comprising a partial through-cavity.

FIG. 2C shows results after formation of a seed layer. FIG. 2D shows results after removing the seed layer outside of the DLB cavity to provide a patterned seed layer. FIG. 2E shows results after forming a second dielectric precursor layer to provide a top portion to enclose the DLB cavity. FIG. 2F shows results after a photolithography and then an etching process that etches an aperture through the second dielectric precursor layer. FIG. 2G shows results after curing the respective polymer precursor layers to provide cured polymer layers. FIG. 2H shows results after metal electroplating to fill the DLB cavity with cavity metal to provide an integral RDL portion, the integral RDL portion extending from the bottom of the DLB cavity to the top of the DLB cavity. FIG. 2I shows results after placement of a solder ball 128 over the integral RDL portion.

DETAILED DESCRIPTION

Figure 1:
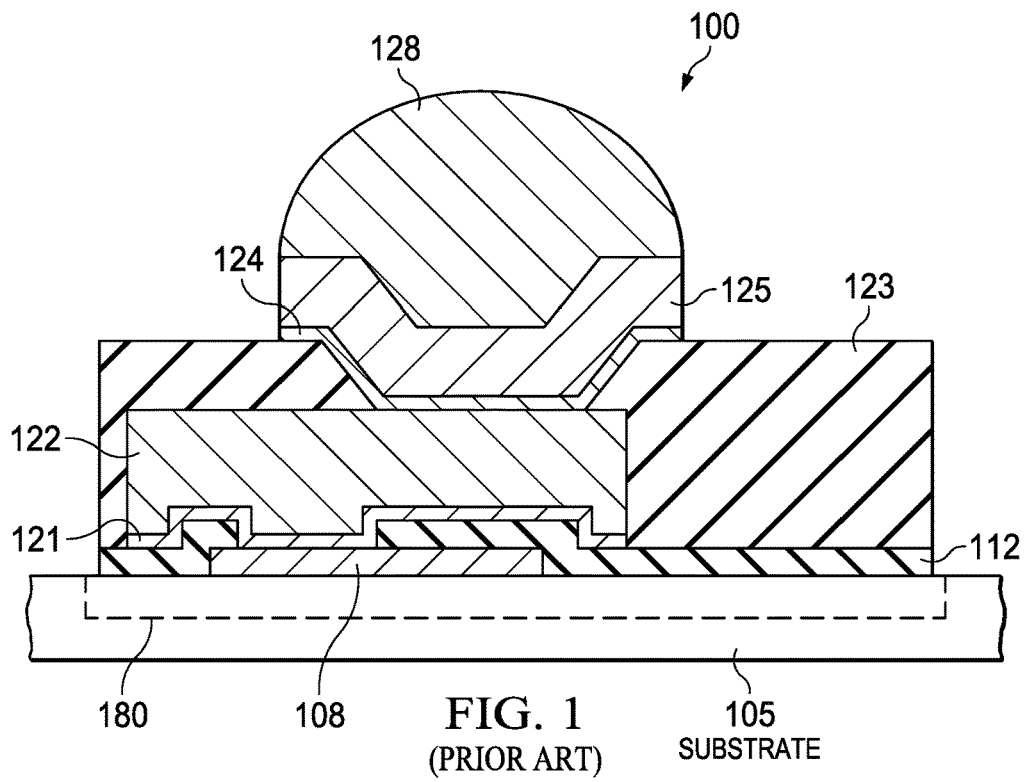
FIG. 1 shows a cross-sectional view of a portion of a WCSP showing a conventional BOPCOA structure that provides a solder ball connection for the WCSP.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

FIGS. 2A-2I shows successive views of an example in-process WCSP, corresponding to results following steps in an example method for forming a BOPCOA structure for a WCSP including an integral RDL portion referred to herein also as being a cavity metal, according to an example aspect. The term "Integral" as used herein is to describe the integral RDL portion/cavity metal as being configured as one continuous metal material having no interfaces, wherein contrast an interface would be present if there were 2 or more deposition (such as plating) processes used.

Figure 2A:
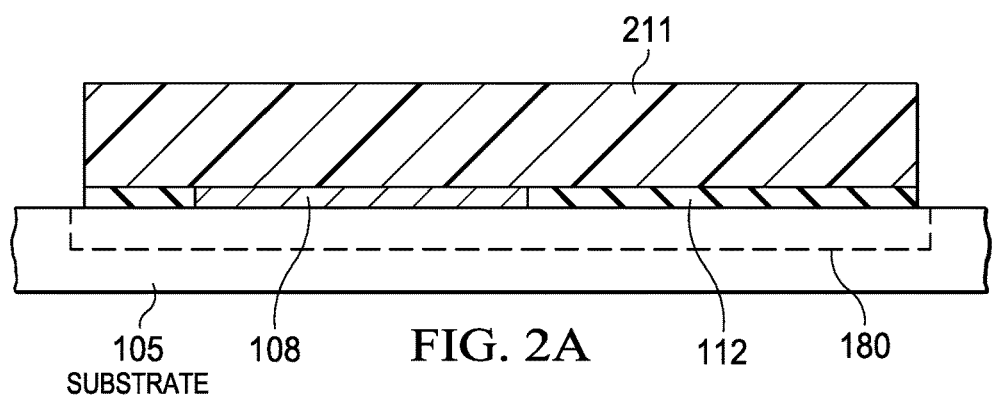
FIGS. 2A-2I shows successive views of an example in-process WCSP, corresponding to results following steps in an example method for forming a BOPCOA structure for a WCSP including a disclosed integral RDL portion referred to herein also as being a cavity metal, according to an example aspect.

FIG. 2A shows results for the in-process WCSP after forming a dielectric precursor layer 211, such as a PI layer, on the top surface of a die comprising a substrate 105 including circuitry 180 electrically connected to die bond pads 108 that are exposed by a passivation layer 112, having the dielectric precursor layer 211 thereon. The circuitry 180 comprises circuit elements (including transistors, and generally diodes, resistors, capacitors, etc.) that can be formed in an epitaxial layer on a bulk substrate material such as silicon configured together for generally realizing at least one circuit function. Example circuit functions include analog (e.g., amplifier or power converter), radio frequency (RF), digital, or non-volatile memory functions.

Figure 2B:
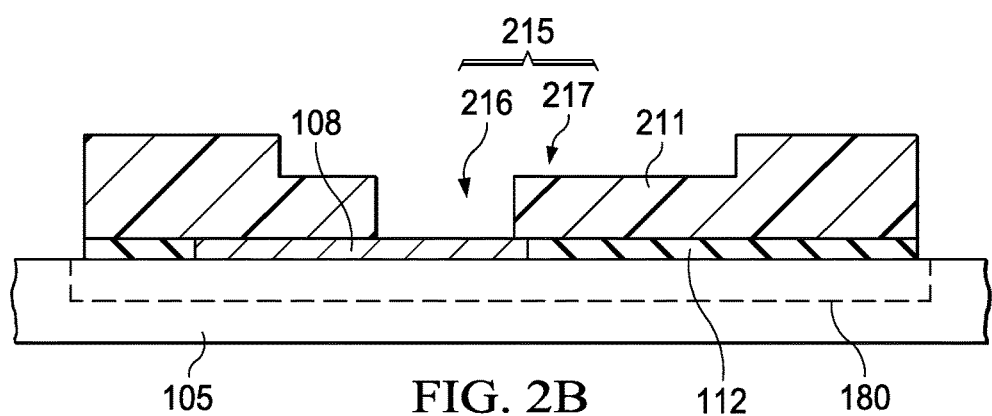

FIG. 2B shows results after a two-step laser ablation process to form a DLB cavity 215 in the dielectric precursor layer 211 including a first cavity 216 comprising a center through-cavity bounded by a second cavity 217 comprising a partial (depth) through-cavity, where one of the laser ablation steps forms the first cavity 216 that overlaps the second cavity 217. A depth of the first cavity 216 is generally between 5 μm and 20 μm.

The order of the respective laser ablation steps is described so that the smaller area opening being the first cavity 216 is aligned with the die bond pads 108, but more generally this order of laser ablation steps is arbitrary. The endpoints for the laser ablation steps can be controlled by using the number of pulses which controls where the ablation step will stop. The laser ablation pattern can be controlled by the mask methodology.

Figure 2C:
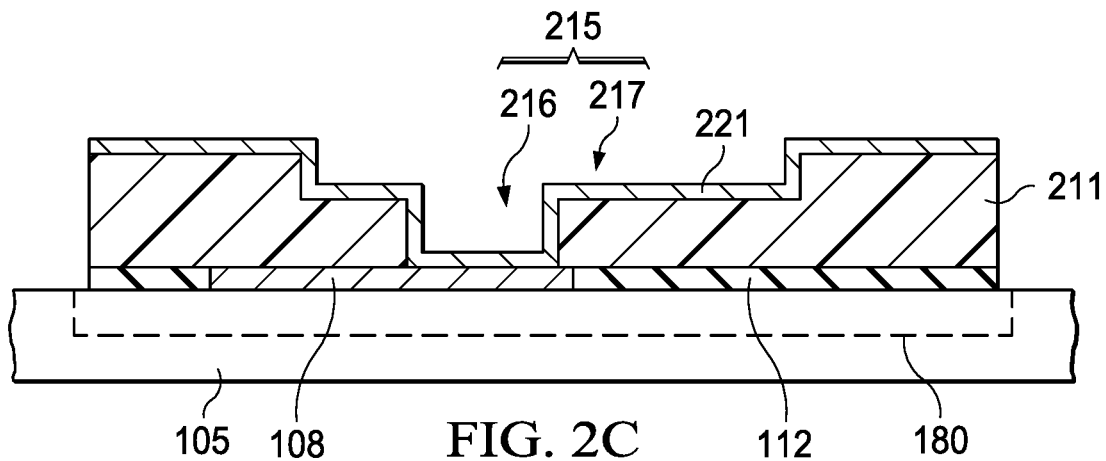
Figure 2D:
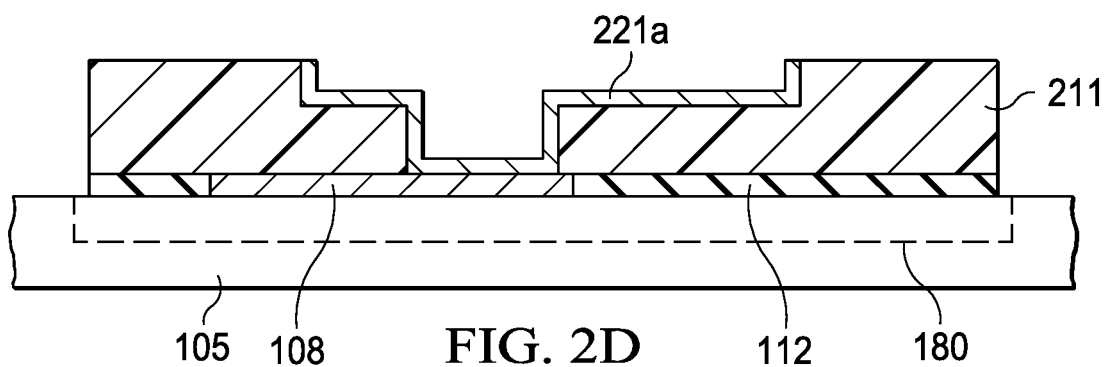
Figure 2E:
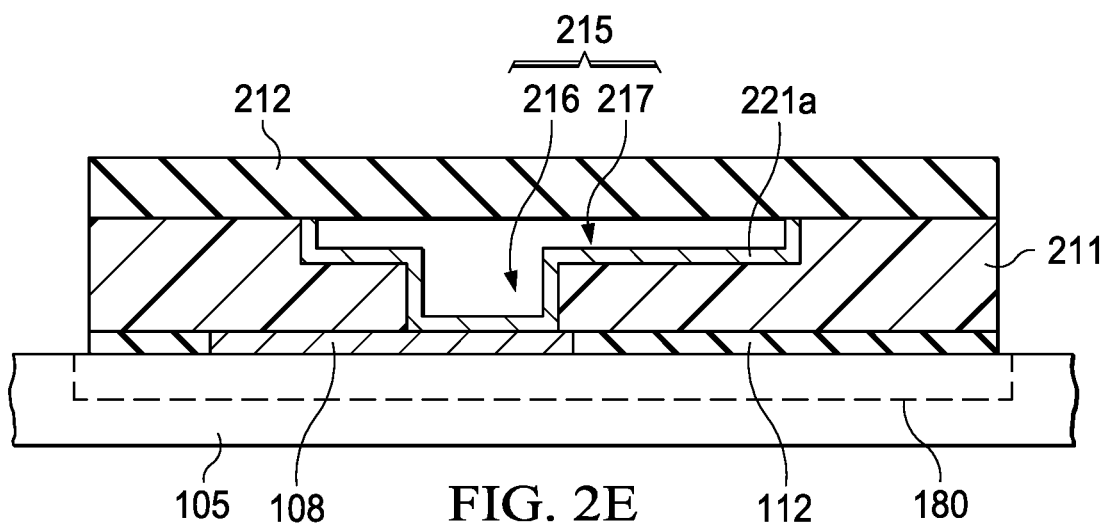

FIG. 2C shows results after formation of a seed layer 221, generally comprising TiW/Cu, using a sputtering process. FIG. 2D shows results after removing the seed layer outside of the DLB cavity 215 to provide a patterned seed layer 221a. FIG. 2E shows results after forming a second dielectric precursor layer 212 that can also comprise a PI precursor layer to provide a top portion to enclose the DLB cavity 215 that may be referred to as a capping dielectric layer as it provides tenting over the DLB cavity 215. The second dielectric precursor layer 212 can comprise PI and have a typical thickness in range of 20 μm to 50 μm.

Figure 2F:
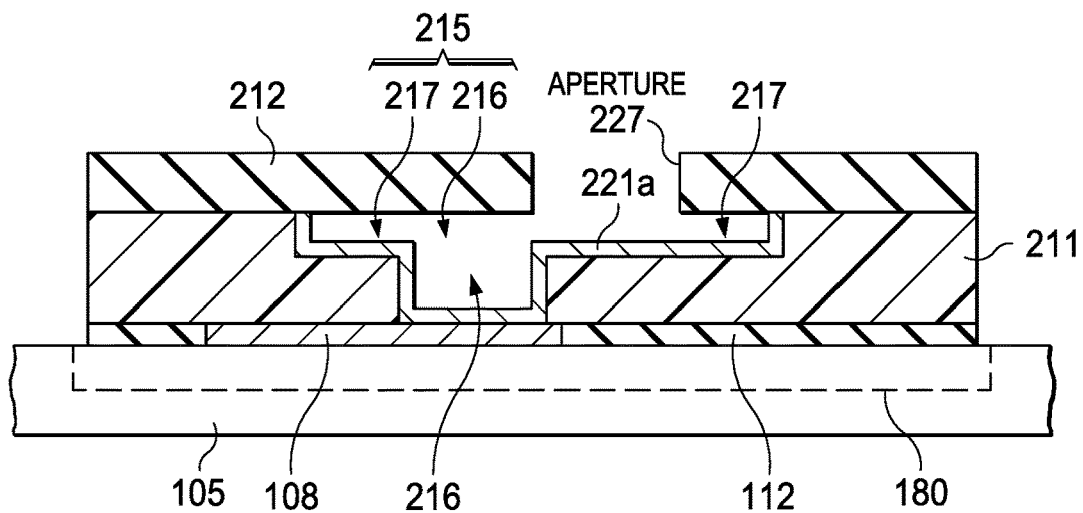

FIG. 2F shows results after a photolithography step (lithography exposure and developing of the photoresist) and then an etching step that etches an aperture 227 through the second dielectric precursor layer 212 shown over the second cavity 217.

Figure 2G:
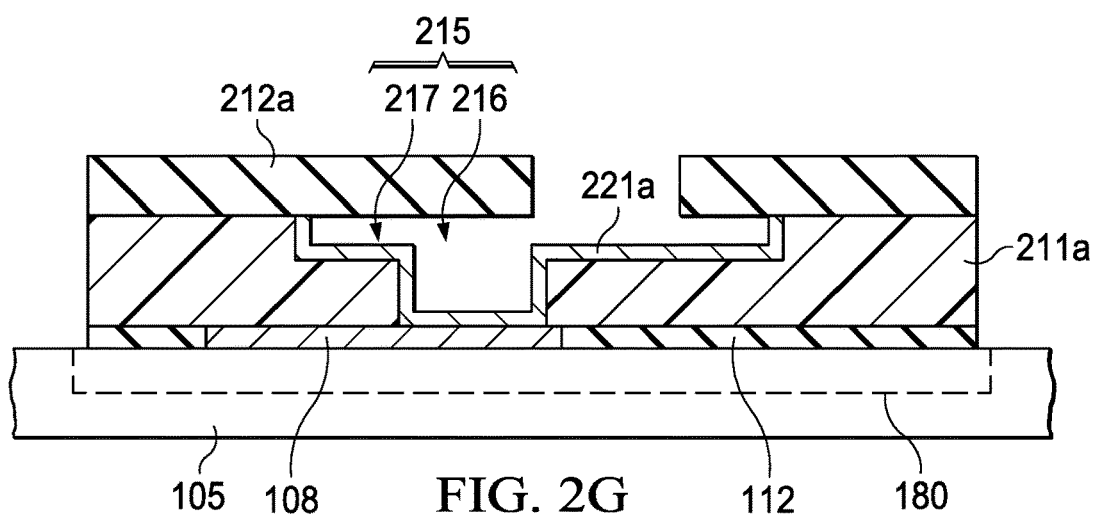
Figure 2H:
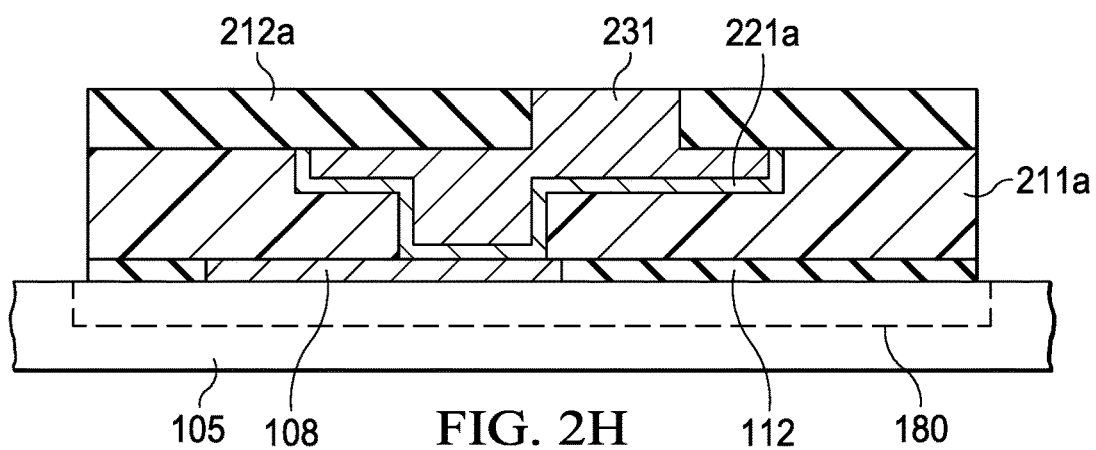
Figure 2I:
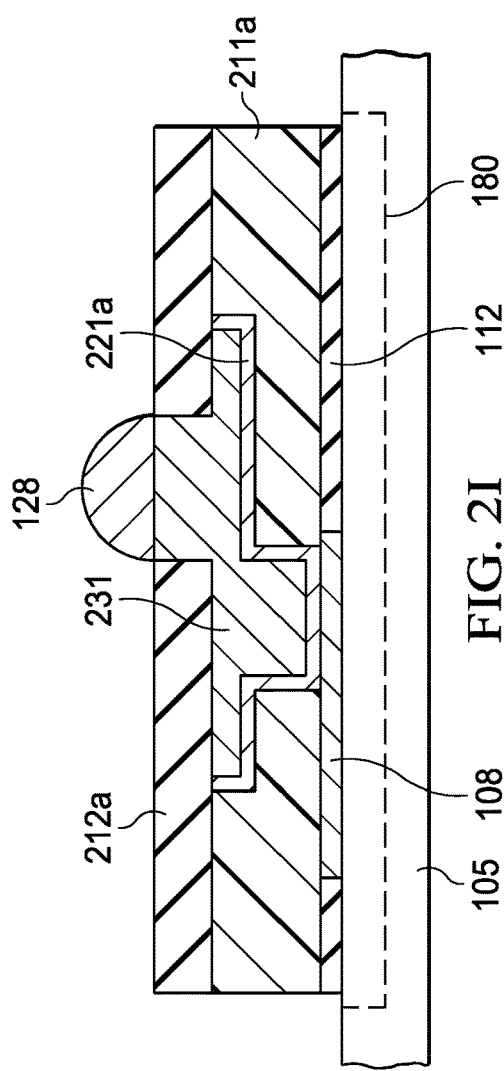

FIG. 2G shows results after curing the respective polymer precursor layers 211, 212 to provide polymer layers 211a, 212a both comprising cured polymer material. FIG. 2H shows results after metal electroplating to fill the DLB cavity 215 with cavity metal to provide an integral RDL portion 231, such as comprising copper. The integral RDL portion 231 extends from the bottom of the DLB cavity 215 to the top of the DLB cavity 215. A thickness of the cavity metal is 10 μm to 50 μm. FIG. 2I shows results after placement of a solder ball 128 over the integral RDL portion 231.

Figure 3:
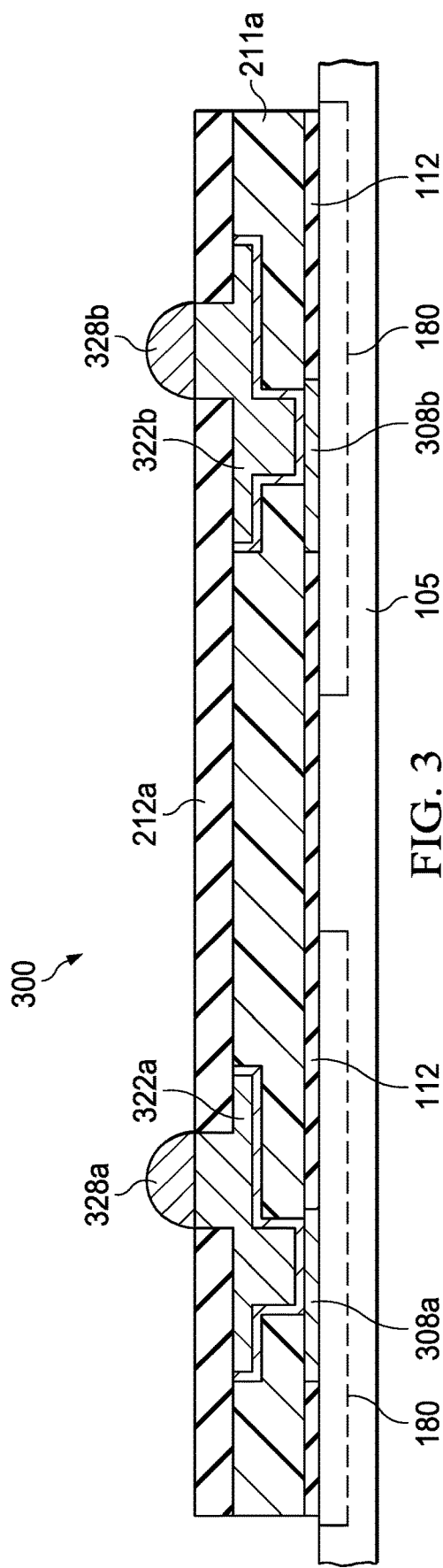
FIG. 3 is a cross-sectional view of a WCSP die including a substrate having circuitry coupled to die bond pads shown as that are exposed from a passivation layer, including a first and a second disclosed integral RDL portions electrically connected to the die bond pads, according to an example aspect. There are respective polymer layers over the passivation layer. There is a solder ball over the respective integral RDL portions.

FIG. 3 is a cross-sectional view of a WCSP die 300 including a substrate 105 having circuitry 180 coupled to die bond pads shown as 308a, 308b, that are exposed from a passivation layer 112, including a disclosed first integral RDL portion 322a and a disclosed second integral RDL portion 322b, electrically connected to the die bond pads 308a, 308b, respectively, according to an example aspect. There are respective polymer layers 211a, 211b over the passivation layer 112. There is a solder ball 328a and another solder ball 328b shown over the respective first and second integral RDL portions 322a, 322b.

The solder balls 328a, 328b being over the integral RDL portions 322a, 322b are electrically connected generally by a conventional metal stack including a plurality of metal layers comprising metal filled through vias through interlayer dielectric (ILD) layers to the die bond pad 108 that is electrically connected to the circuitry 180 on the WCSP die 300. The solder balls 328a, 328b can optionally be placed on top of a UBM layer, and placed using a ball drop method or a solder paste deposition. In some disclosed arrangements there is no UBM layer so that the solder balls 328a, 328b are directly on the integral RDL portions 322a, 322b.

The DLB cavity 215 having a first cavity 216 being a through-cavity region and a second cavity 217 being a partial through-cavity region described above that are now for WCSP die 300 filled with the integral RDL portions 322a, 322b, as opposed to a cavity having a single depth, is provided for at least two purposes. If the cavity has only a single depth, then the bond pads that are close together on the WCSP die 300 may short together. Having the DLB cavity 215 include the first cavity 216 and the second cavity 217 having different depths also provides better routability and flexibility for the circuitry 180.

Although not shown, multiple ones of the WCSP die on a wafer can be processed together in wafer form including forming a disclosed BOPCOA electrically connected to the die bond pads each including an integral RDL portion, and later singulated to separate individual WCSP die units using, for example, mechanical or laser sawing.

Disclosed aspects can be integrated into a variety of assembly flows to form a variety of different semiconductor packages and related products. The semiconductor package can comprise single WCSP or multiple WCSP. The WCSP may include various elements therein and/or layers thereon, including barrier layers, dielectric layers, device structures, active elements and passive elements including source regions, drain regions, bit lines, bases, emitters, collectors, conductive lines, conductive vias, etc. Moreover, the WCSP die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A wafer chip scale package (WCSP), comprising:
a substrate comprising a semiconductor surface including circuitry electrically connected to die bond pads exposed by a passivation layer, further comprising a first dielectric layer over the passivation layer;
a first cavity in the first dielectric layer comprising a center through-cavity bounded by a second cavity comprising a partial through-cavity;
a second dielectric layer that covers the first and second cavities except for an aperture over the second cavity;
a metal filling the first and second cavities and the aperture, the metal being electrically connected to the die bond pads; and
a solder ball on the metal positioned within the aperture.

2. The WCSP of claim 1, wherein the metal is configured as an integral structure of continuous metal material having no interfaces.

3. The WCSP of claim 1, wherein a depth of the first cavity is between 5 μm and 20 μm, and wherein a thickness of the cavity metal is 10 μm to 50 μm.

4. The WCSP of claim 1, wherein there is no under-bump metallization (UBM) layer under the solder ball.

5. The WCSP of claim 1, wherein the aperture is exclusively over the second cavity.

6. The WCSP of claim 1, wherein the first dielectric layer comprises a polyimide (PI).

7. The WCSP of claim 1, wherein the metal is part of a redistribution layer (RDL).

8. The WCSP of claim 1, wherein the metal comprises copper.

9. The WCSP of claim 1, wherein a seed layer lining the first and second cavities comprises TiW/Cu.

10. A method, comprising:
providing a wafer chip scale package (WCSP) including circuitry electrically coupled to die bond pads exposed by a passivation layer, further comprising a first dielectric layer the passivation layer;
forming in the dielectric layer a first cavity comprising a center through-cavity bounded by a second cavity comprising a partial through-cavity;
forming a pattern seed layer that lines the first and second cavities;
forming a second dielectric layer on the first dielectric layer that covers the first and second cavities;
forming an aperture in the second dielectric layer over the second cavity;
plating a metal in the first and second cavities and the aperture; and
positioning a solder ball on the metal in the aperture.

11. The method of claim 10, wherein the plating consists of a single plating step, and wherein the metal is configured as an integral structure of continuous metal material having no interfaces.

12. The method of claim 10, wherein laser ablation is used to form the aperture, the laser ablation comprising a two-step laser ablation process including a first ablation step for forming the first cavity and a second ablation step for forming the second cavity.

13. The method of claim 10, wherein the secondcapping dielectric layer comprises a polyamide (PI).

14. The method of claim 10, wherein a depth of the first cavity is between 5 μm and 20 μm.

15. The method of claim 14, wherein a thickness of the cavity metal is 10 μm to 50 μm.

16. The method of claim 10, wherein there is no under-bump metallization (UBM) layer under the solder ball.

17. The method of claim 10, wherein the aperture is exclusively over the second cavity.

18. The method of claim 10, wherein the top dielectric layer comprises a polyimide (PI).

19. The method of claim 10, wherein the metal is part of a redistribution layer (RDL).

20. The method of claim 10, wherein the forming of the patterned seed layer comprises chemical mechanical planarization (CMP) to pattern the seed layer.

21. A wafer chip scale package (WCSP), comprising:
a substrate comprising a semiconductor surface including circuitry electrically connected to die bond pads exposed by a passivation layer, further comprising a dielectric layer covering the passivation layer;
a first cavity through the dielectric layer bounded by a second cavity partially through the dielectric layer;
a second dielectric layer covering the dielectric layer except for an aperture over the second cavity;
a metal filling the first and second cavities and the aperture and contacting at least one of the die bond pads; and
a solder ball on the metal within the aperture.

22. The WCSP of claim 21, wherein the metal is at least a part of a redistribution layer.

23. The WCSP of claim 21, wherein the dielectric layer, the first cavity, the second cavity and the second dielectric layer form a dielectric layer bounded (DLB) cavity.

24. The WCSP of claim 21, wherein the aperture is exclusively over the second cavity.

* * * * *